(12) United States Patent
Blatt et al.

(10) Patent No.: US 7,421,382 B2
(45) Date of Patent: Sep. 2, 2008

(54) DATA ANALYSIS TECHNIQUES FOR DYNAMIC POWER SIMULATION OF A CPU

(75) Inventors: Miriam G. Blatt, Menlo Park, CA (US); David J. Greenhill, Portola Valley, CA (US); Claude R. Gauthier, Fremont, CA (US); Kathirgamar Aingaran, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 748 days.

(21) Appl. No.: 10/010,238

(22) Filed: Dec. 7, 2001

(65) Prior Publication Data

US 2003/0110019 A1 Jun. 12, 2003

(51) Int. Cl.
*G06F 17/50* (2006.01)
*G06F 9/45* (2006.01)

(52) U.S. Cl. ............... 703/13; 716/1; 716/5; 703/14

(58) Field of Classification Search ............... 703/13, 703/18, 14; 716/1, 5
See application file for complete search history.

(56) References Cited

U.S. PATENT DOCUMENTS

| | | | |
|---|---|---|---|
| 5,136,528 A * | 8/1992 | Fordham et al. ............ 703/6 |
| 5,349,542 A * | 9/1994 | Brasen et al. ............ 703/15 |
| 5,555,201 A * | 9/1996 | Dangelo et al. ............ 716/1 |
| 5,559,997 A * | 9/1996 | Tsuchida et al. ............ 716/1 |
| 5,677,856 A * | 10/1997 | Tani ............ 703/13 |
| 5,812,433 A * | 9/1998 | Kawabata et al. ............ 703/13 |
| 5,815,693 A * | 9/1998 | McDermott et al. ............ 713/501 |
| 5,844,822 A * | 12/1998 | Yoshida ............ 703/13 |
| 5,926,394 A * | 7/1999 | Nguyen et al. ............ 716/1 |
| 6,009,256 A * | 12/1999 | Tseng et al. ............ 703/13 |
| 6,014,510 A * | 1/2000 | Burks et al. ............ 703/19 |
| 6,125,334 A * | 9/2000 | Hurd ............ 702/60 |
| 6,397,172 B1 * | 5/2002 | Gurney ............ 703/14 |
| 6,496,957 B1 * | 12/2002 | Kumagai ............ 716/4 |

OTHER PUBLICATIONS

Christesen et al., "Analog and Mixed-Signal Modeling Using the VHDL-AMS Language" 36th Design Automation Conference 1999. p. 1-199.*
Tiwari et al., "Power Analysis of Embedded Software: A First Step Towards Software Power Minization" IEEE 1994. p. 437-445.*
Greenhill-D. "The Impact of Technology Scaling on Microprocessor Design" Seminar abstract 1999 p. 1.*

(Continued)

*Primary Examiner*—Albert DeCady
*Assistant Examiner*—Thomas H Stevens
(74) *Attorney, Agent, or Firm*—Osha Liang LLP

(57) ABSTRACT

A method for data analysis of power modeling for a microprocessor has been developed. The method takes multiple values of power data from a power modeling simulator and generates summary data to characterize the power data behavior. Summary data views include results characterizing behavior in a single cycle and behavior across multiple cycles. Data is viewed both at an absolute level to characterize total power and relative to previous levels to characterize power derivatives. Summary data is derived from power generated every cycle when running specific benchmark programs on the power simulator.

14 Claims, 5 Drawing Sheets

| Cycle | 0 | 1 | 2 | 3 | 4 | 5 | 6 | 60 |
|---|---|---|---|---|---|---|---|---|
| Power | 100 | 115 | 113 | 114 | 112 | 113 | 111 | 62 |
| SCD |  | +15 | -2 | +1 | -2 | +1 | -2 | 64 |
| SCD/MCD % |  |  | 2/15 13% |  | 2/14 14% |  | 2/13 15% | 66 |
| DROP/TOP % |  |  | 2/15 13% |  | 3/15 20% |  | 4/15 27% | 68 |

OTHER PUBLICATIONS

Booba et al., "IC Power Distribution Challenges" Jan. 2001. International Conference on Computer-Aided Design IEEE/ACM p. 643-650.*

Bogliolo et al., "Gate-Level Power and Current Simulation of CMOS Integrated Circuits" 1997 IEEE p. 473-488.*

Brown et al., "Overview of Complementary GaAs Technology for High-Speed VLSI Circuits" 1998 IEEE p. 47-51.*

Bogliolo et al., "Node Sampling: a Robust RTL Power Modeling Approach" 1998 ACM p. 461-467.*

Gupta et al., "Analytical Models for RTL Power Estimation of Combinational and Sequential Circuits" 2000 IEEE p. 808-813.*

Hsiao et al., "Effects of Delay Models on Peak Power Estimation of VLSI Sequential Circuits", IEEE 1997 p. 45-51.*

Mudge, T., "Power: A First-Class Architectural Design Contraint" INSPEC p. -52-58.*

Musoll et al., "Scheduling and Resource Binding for Low Power" 1995 8th International Symposium on System Synthesis p. 104-109.*

Seng et al., "Power-Sensitive Multithreaded Architecture" Sep. 2000, p. 17-20.*

* cited by examiner

| Cycle | 0 | 1 | 2 | 3 | 4 | 5 | 6 | |
|---|---|---|---|---|---|---|---|---|
| Power | 100 | 115 | 113 | 114 | 112 | 113 | 111 | 62 |
| SCD | | +15 | -2 | +1 | -2 | +1 | -2 | 64 |
| SCD/MCD % | | | 2/15 13% | | 2/14 14% | | 2/13 15% | 66 |
| DROP/TOP % | | | 2/15 13% | | 3/15 20% | | 4/15 27% | 68 |

(row 60: Cycle)

*Figure 4*

DATA ANALYSIS TECHNIQUES FOR DYNAMIC POWER SIMULATION OF A CPU

BACKGROUND OF INVENTION

1. Field of the Invention

The invention relates to the field of microprocessor design. More particularly, the invention relates to power modeling methodologies for a microprocessor.

2. Background Art

With the increased clock frequencies of modern high-performance microprocessors, power usage has increased as well. Consequently, limiting power dissipation has become one of the most stringent design targets. Thus, it is very important to obtain a model providing information to help engineers understand power behavior in a microprocessor. Typically, power behavior is observed by feeding input information into a simulator and then analyzing the results.

FIG. 1 shows a prior art full-chip power modeling simulation in a microprocessor. CPU activity data is generated each cycle (20) and combined with power values per unit of the activity data (22) using power model equations (24). Three values are provided for each unit of activity data (22) corresponding to minimum (MIN), typical (TYP), and maximum (MAX) circuit power conditions. The CPU activity data changes every cycle. CPU activity data (22) may include (1) the number of instructions retired in a current cycle, (2) the number of 1's in a cache line being filled from memory, and/or (3) the number of instructions in stage 3 of the floating point multiplier. The simulator calculates the power model equation results every cycle and sums them up for equations/sub-blocks to generate full-chip MIN, TYP, and MAX power values (26). After the run, power data is analyzed/summarized (28) by various methods including taking the average over several cycles and the peak variation in power from one cycle to the next. Average power consumption may be used to estimate the sustained temperature that the cooling system must be designed to tolerate. Peak power variation from one cycle to the next can be used to design decoupling capacitors and other circuitry to tolerate changes in inductance.

FIG. 2 shows an example of simulation results generated from a prior art full-chip power modeling simulation. The upper curve represents the worst case maximum value (MAX) at each cycle during a run. The middle curve represents typical power (TYP) for each cycle during the run. The lower curve represents the best case minimum power value (MIN) at each cycle in the run. Power behavior may be categorized in terms of characteristic factors. A factor "Peak" is defined as the highest power point reached over a run. A factor "Low" is defined as the lowest power point reached over a run. A factor "Average" (Avg) is defined as an average over a run. For example, Peak-Min (40) means the highest power point on the Min curve (34). Low-Typ (38) means the lowest power value on the Typ curve (32). Then, Peak-Max (36) means the highest power point on the Max curve (30). The simulation results may be analyzed using various methods. For example, they may be analyzed in terms of Peak, Avg, Low power values, or any other user-defined characteristic factors.

As the complexity of microprocessors increases, design engineers must deal with massive amounts of information from the results of power modeling simulations. Thus, it is important for the engineers to be able to obtain summary information to get a better understanding of the power behavior of a microprocessor. For example, summary information may provide information to help the engineers design system cooling and charge pumps, and to avoid resonance frequencies.

SUMMARY OF INVENTION

In one aspect, a method for analyzing a power modeling simulation comprises receiving a plurality of values of power data from a power modeling simulator, generating summary information relating to single cycle behavior of the power data (where the power data is associated with a specific cycle in the power modeling simulation), analyzing the power modeling simulation using the summary information.

In another aspect, a method of analyzing power modeling simulation comprises receiving a plurality of values of power data from a power modeling simulator, generating summary information relating to multiple cycle behavior of the power data (where the power data is associated with multiple cycles in the power modeling simulation), and analyzing the power modeling simulation using the summary information.

In another aspect, a method of data analysis for a power modeling simulation comprises receiving a plurality of values of power data from a power modeling simulator, generating summary information relating to a multi-cycle derivative of the power data (where each power data is associated with at least one cycle in a simulation, and where the multi-cycle derivative is a derivative of at least two particular power data in non-successive cycles), and analyzing the power modeling simulation using the summary information.

Other aspects and advantages of the invention will be apparent from the following description and the appended claims.

BRIEF DESCRIPTION OF DRAWINGS

FIG. 4 shows an example of power simulation results to describe an embodiment of the invention

DETAILED DESCRIPTION

The present invention relates to data analysis methods for dynamic power simulation for a microprocessor. In one embodiment, the outputs of a simulator are selectively processed to generate summary information for power behavior of a microprocessor in a run.

Figure 1:
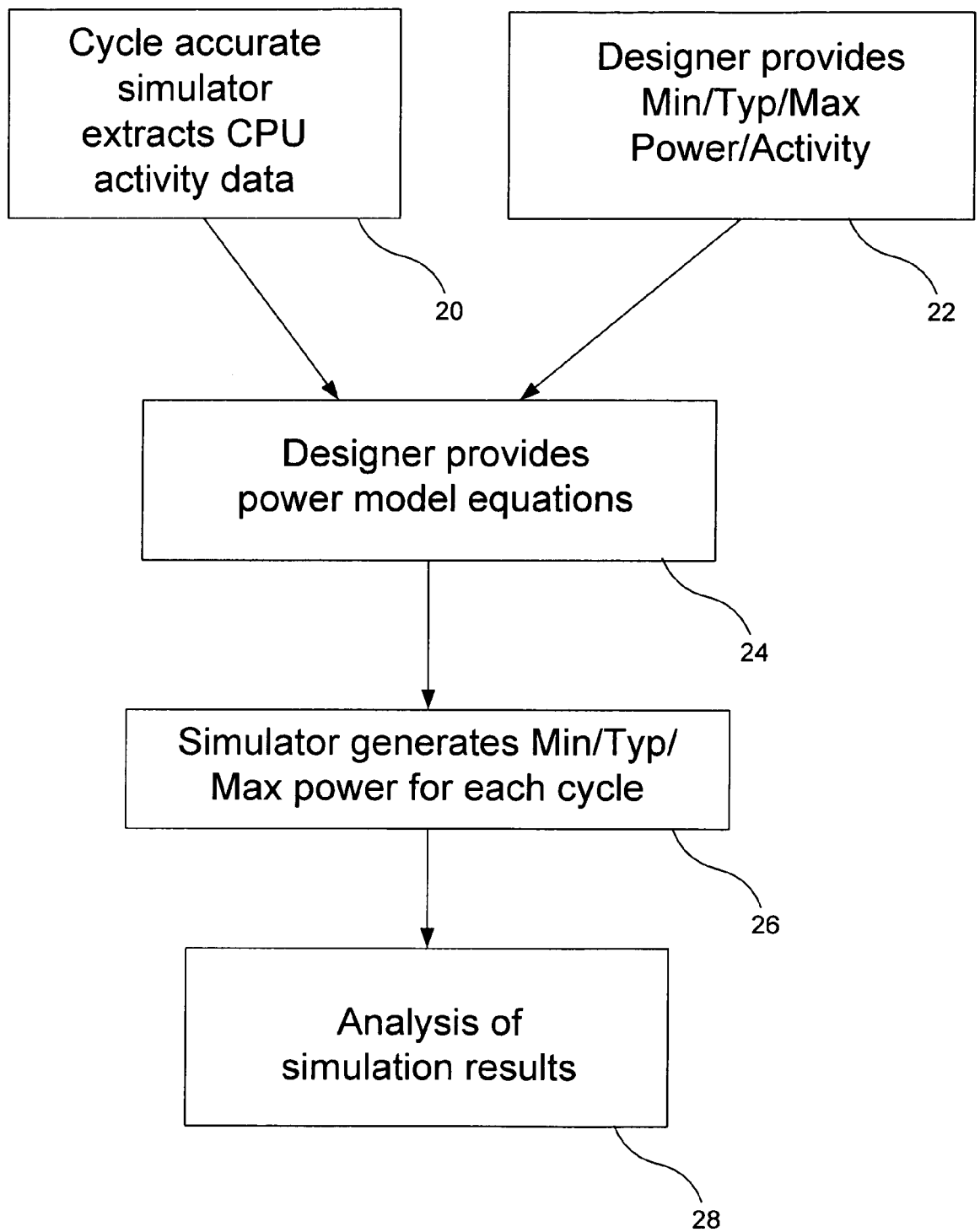
FIG. 1 shows a prior art power modeling simulation in a microprocessor.
Figure 2:
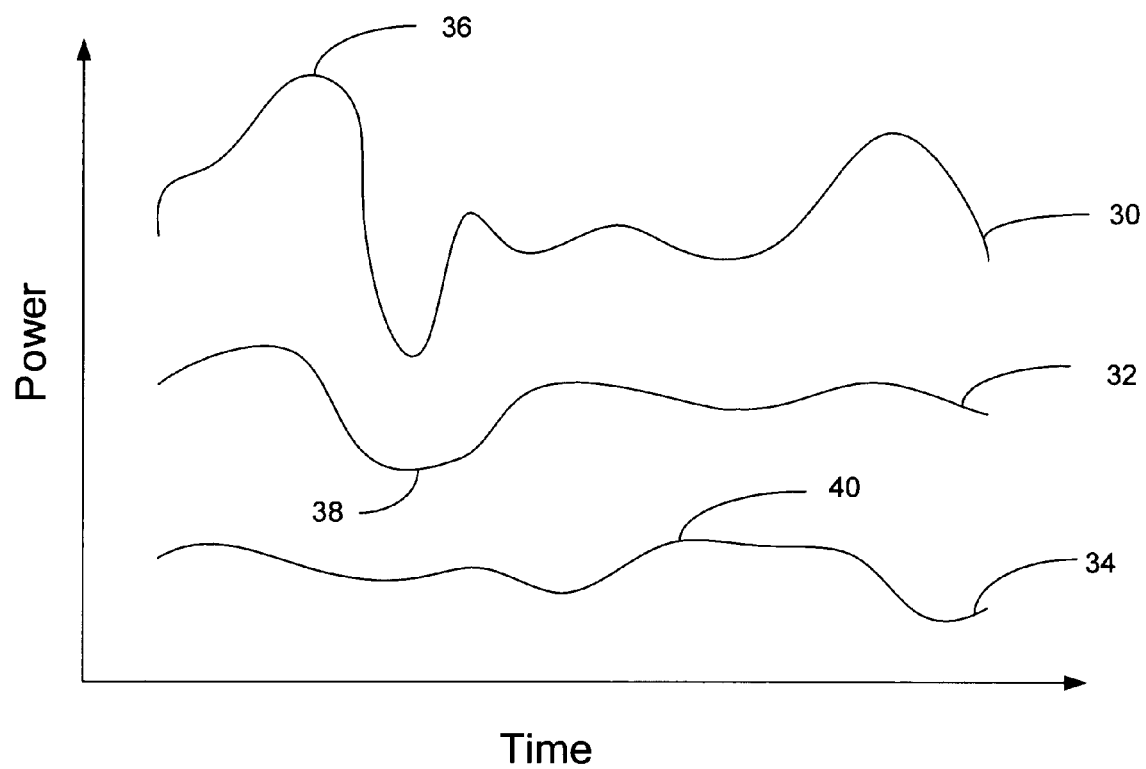
FIG. 2 shows an example of simulation results generated from a prior art power modeling simulation.
Figure 3:
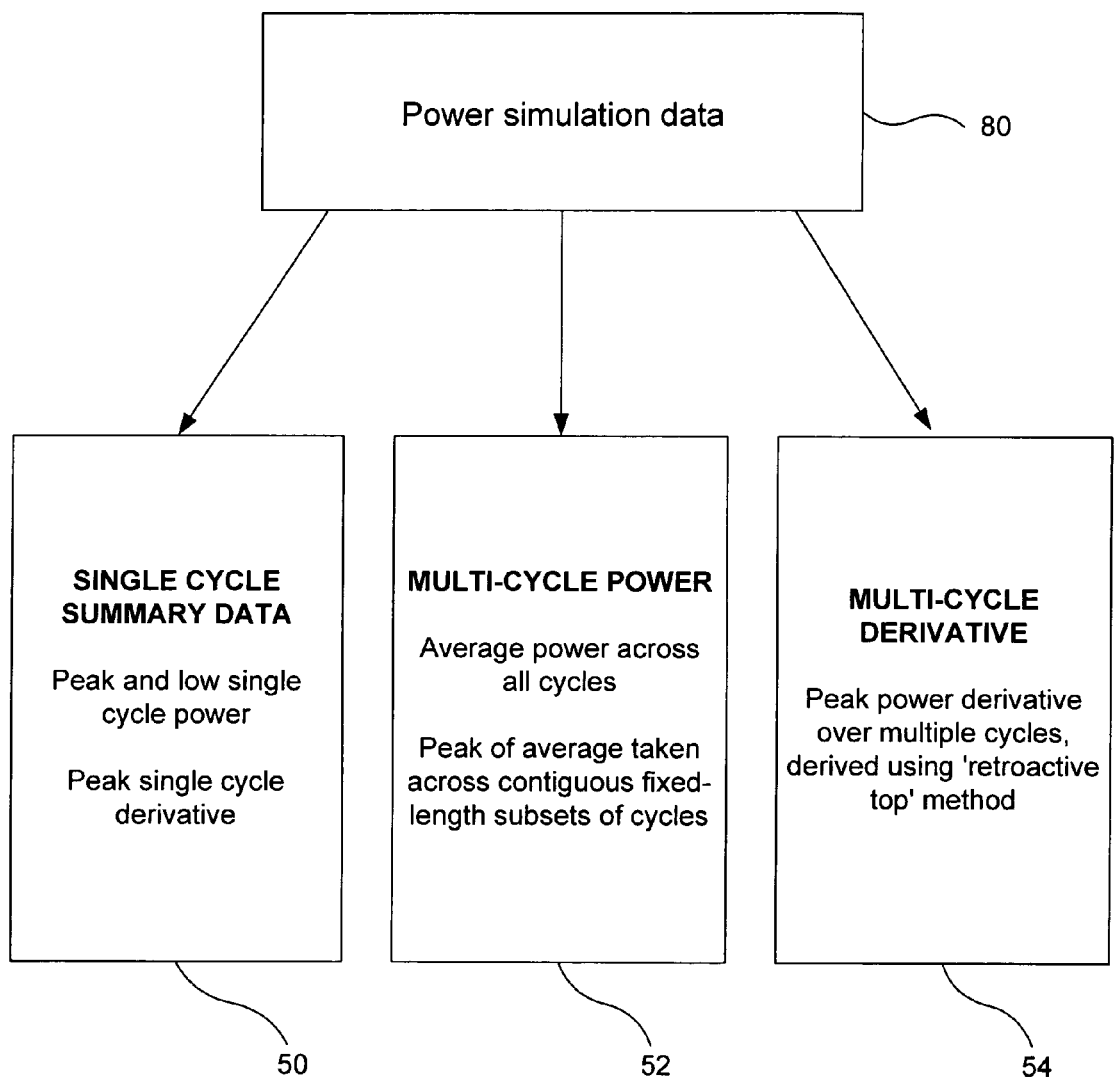
FIG. 3 shows analysis processes generating summary information from power simulation data in accordance with an embodiment of the invention.

FIG. 3 shows a process of generating summary information from power simulation data in accordance with an embodiment of the invention. This embodiment includes three types of summary information: single cycle summary data (50); multi-cycle power (MCP) (52); and multi-cycle derivative (MCD) (54). The resources for these summaries are derived from power simulation data (80).

To observe rises and falls in power data generated from the simulation during each cycle, single cycle summary data (50) is used. The summary (50) provides the absolute values of Peak and Low, which are derived from the absolute values both within a single cycle and over multiple cycles. In the summary, the Peak and Low absolute values are associated with a specific cycle. The derivative is defined as the difference between two particular associated power values in the simulation.

In some applications, information from a single cycle may not be enough to accurately reflect the power dissipation. It may take multiple cycles to observe the desired changes in the power dissipation. Thus, in this case, the multi-cycle power (MCP) (52) scheme is used. The MCP (52) scheme provides average values over multiple cycles and reports the peak average value. In this scheme, at every cycle, power data from the current cycle is included with the previous data in a run. Then, the average is calculated. The next average for an N-cycle MCP is obtained by adding in the power for the current cycle, subtracting out the power from N cycles ago, and dividing the total by N to obtain the N-cycle average. The current N-cycle average is compared to the peak seen so far, and if it exceeds the existing peak, the peak is updated to the current N-cycle average. This process is repeated until all of the power data are included. After the process is complete, the peak average is reported. The MCP (52) scheme can be used for any of Min, Typ, or the Max curves. However, the MCP (52) scheme is preferably used for the Max and "TypMax" curves because of practical considerations. For example, the considerations may include observation of power dissipation in a microprocessor. In this case, the Max curve represents the power dissipation at the extreme worst case. The TypMax curve is a hypothetical curve halfway between Typ and Max. It represents the power dissipation at a more realistic worst case.

Change in power from one cycle to the next does not cover the full range of the change if subsequent cycles continue in the same direction. To collect data showing the full range the power changes, the concept of multi-cycle derivative (MCD) (54) was developed. In this embodiment, a multiple cycle derivative is defined as a group of single cycle power values that progress primarily in one direction. To determine when the direction has changed by a large enough amount to end one MCD and begin the next, various schemes may be applied. For example, an SCD/MCD scheme may be used for the detection of the end of MCD. The scheme uses a method of comparing an SCD/MCD ratio with a threshold value—a value chosen to accept small changes in the other direction as part of the current MCD while using big changes to terminate the current MCD and begin the next one going the other direction. In the ratio, the numerator represents an absolute value of the SCD. The denominator represents the current MCD value, which is obtained from the difference between the power level at the beginning of the MCD and the current power level. A new MCD starts if the ratio becomes larger than the threshold value. This is an implementation of the MCD (54) scheme derived from single cycle data. As one skilled in the art will readily appreciate, as used herein, SCD means single-cycle derivative.

However, for determining the end of the MCD, it may be difficult for the SCD/MCD scheme to detect accurately the behavior of power data in some special cases. For example, some results may have a "saw-tooth" drop-off behavior, which will be explained with reference to FIG. 4. For a more robust method to determine the end point of the MCD, a "retroactive top" scheme is introduced. This scheme uses a method designed to better approximate how human eyes recognize the endpoints of rises and falls in a curve.

When the retroactive top scheme encounters a positive direction detection of the MCD, and the power data reaches the highest value, that value is recorded. If a new SCD turns in the other direction, which represents a negative value of SCD for the positive direction detection, a "DROP/TOP" ratio is calculated and compared with a threshold value. The "DROP" value is defined as a value calculated by subtracting the current power value from the highest power value. The "TOP" value is defined as a value calculated by subtracting the start power value from the highest power value. In the same manner, for negative direction detection of the MCD, the lowest value is recorded as the bottom value. Then, if a SCD turns in a positive direction, a ratio is calculated. When the ratio reaches a threshold value, the MCD ends at the cycle of the lowest value. Then, the size of the MCD is reported.

FIG. 4 shows an example of power simulation results having saw-tooth drop-off behavior. In this example, the detection process to determine the end of the MCD is explained by using the SCD/MCD scheme and the retroactive top schemes. This exemplary simulation results include the power data (62) presented with SCD (64), SCD/MCD (66), and DROP/TOP (68). The data (62) ranges from cycle 0 to 6 (60). To determine the end of the first MCD using the SCD/MCD scheme, first, the SCD is calculated from the data by subtracting the previous value from the current value. The MCD is calculated by subtracting a start value from the current value. Then, the ratio is calculated. In this example, the ratios are calculated as 2/15 at cycle 2, 2/14, at cycle 4, and 2/13 at cycle 6. These ratios are equivalent to 13%, 14%, and 15%, respectively.

According to the retroactive top scheme, the top value is recorded as 115. Then, a drop/top ratio is calculated when an SCD turns in the other direction, a negative value in this case. For example, DROP/TOP ratios (68) are calculated to be 2/15 at cycle 2, 3/15 at cycle 4, and 4/15 at cycle 6. These ratios are equivalent to 13%, 20%, and 27%, respectively. Assuming that a threshold value is 15% in this example, the SCD/MCD scheme detects the end of the first MCD at cycle 5 with length 5 cycles and size 13W because the ratio reaches the threshold value at cycle 6.

Figure 5:
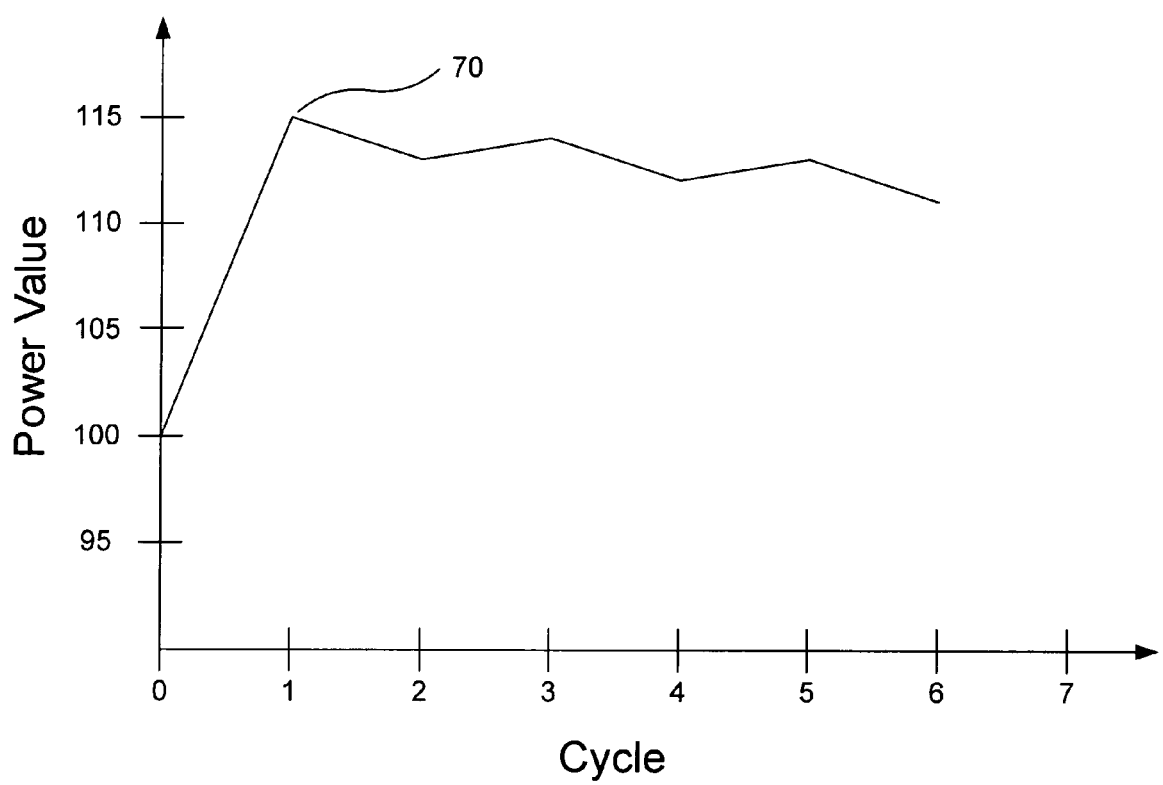
FIG. 5 shows an example of a plot using power data presented in FIG. 4.

According to the retroactive top scheme, when the DROP/TOP ratio reaches a threshold value, the MCD is determined and ends at the top value. Thus, in this example, the ratio reaches 15% between cycle 2 and cycle 4. As a result, the end of the first MCD is reported at cycle 1 with a length of 1 cycle and size 15W. This scheme determines the end of MCD by returning to the top value when forward values are calculated. FIG. 5 shows an example of a plot using the power data presented in FIG. 4. In this example, the end (70) of the first MCD can be easily recognized.

After all MCDs are obtained using the MCD scheme, the MCDs may be grouped using an exponential binning approach to obtain information on the MCDs depending on the length of the MCD in cycles. In this approach, the index of the length increases exponentially. That is, the index is doubled starting at 1. Thus, the MCDs are grouped in lengths of 1, 2, 4, 8, 16, 32, 64, etc. The grouped MCDs may be summarized by using a histogram. In this case, for each group, the total number of the grouped MCDs is reported and the peak MCD is also reported with information of the size and the number of cycles.

The results derived from the schemes are gathered into a resulting file. The file is reported as summary information for power behavior of a microprocessor in the run. The file may be stored in a database or any other storage mechanism to help engineers design system cooling and charge pumps, and avoid resonance frequencies. Additionally, such information may help design a microprocessor with a minimum number and variety of charge pumps that cover major widths and lengths of power derivatives.

Generating summary information for power data is achieved by selectively processing power information generated from a power modeling simulation. However, alternative schemes or summaries may also be added to analyze the power information.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for analyzing a power modeling simulation, comprising:
   receiving simulated power value data from a power modeling simulator, wherein the power value data comprises at least one type of power value selected from MAX, TYP, MIN, and TypMax;
   generating a set of summary data from the power value data; and
   reporting the summary data,
   wherein the summary data includes at least one type of data selected from single-cycle summary data configured to report a peak single cycle derivative power value, wherein a derivative power value is a difference between two particular associated power values in the simulation, multi-cycle summary data configured to report a peak average power value over multiple cycles, and multi-cycle derivative data configured to report a peak derivative power value over multiple cycles.

2. The method of claim 1, wherein:
   generating summary data includes generating multi-cycle summary data, comprising:
   calculating a value of a single-cycle derivative,
      wherein the single-cycle derivative is a derivative of two particular power data in a set of successive cycles.

3. The method of claim 2, wherein the single-cycle derivative is a peak single-cycle derivative.

4. The method of claim 1, further comprising:
   applying an automatic detection scheme to detect an end for an multi-cycle derivative (MCD), if an multi-cycle derivative is included in the summary, wherein the automatic detection scheme is one selected from single-cycle derivative (SCD)/MCD, DROP/TOP, and a combination thereof.

5. A method of analyzing power modeling simulation for designing a chip, comprising:
   obtaining a plurality of power value data from a power modeling simulator, wherein the plurality of power values comprises at least one type of power value selected from MAX, TYP, MIN, and TypMax;
   generating a set of summary data; and
   reporting the summary data as parameters for chip design,
   wherein the summary data includes at least one type of data selected from single-cycle summary data configured to report a peak single cycle derivative power value, wherein a derivative power value is a difference between two particular associated power values in the simulation, multi-cycle summary data configured to report a peak average power value over multiple cycles, and multi-cycle derivative data configured to report a peak derivative power value over multiple cycles.

6. The method of claim 5, wherein generating summary data comprises:
   calculating a multiple-cycle power average, wherein the multi-cycle power average is an average of the power value data over a plurality of cycles.

7. The method of claim 6, wherein a length of the plurality of cycles is fixed.

8. The method of claim 6, wherein generating summary data further comprises:
   calculating a peak value of the multi-cycle power average.

9. The method of claim 5, further comprising:
   applying an automatic detection scheme to detect an end for an multi-cycle derivative, if an multi-cycle derivative is included in the summary, wherein the automatic detection scheme is one selected from single-cycle derivative (SCD)/MCD, DROP/TOP, and a combination thereof.

10. A method of data analysis for a power modeling simulation, comprising:
    obtaining a plurality of power value data from a power modeling simulator, wherein the power value data comprises at least one type of power value selected from MIN, TYP, MAX, and TypMax;
    generating a set of summary data from the power value data;
    analyzing the summary data according to a design requirement; and
    reporting a result of the analyzing step;
    wherein the summary data includes at least one type of data selected from single-cycle summary data configured to report a peak single cycle derivative power value, wherein a derivative power value is a difference between two particular associated power values in the simulation, multi-cycle summary data configured to report a peak average power value over multiple cycles, and multi-cycle derivative data configured to report a peak derivative power value over multiple cycles.

11. The method of claim 10, further comprising:
    calculating a value of the multi-cycle derivative.

12. The method of claim 11, further comprising:
    setting a threshold value as a reference value for determining the end of a current multi-cycle derivative;
    calculating a single-cycle derivative; calculating a derivative of a start value and an end value of associated power data in the current multi-cycle derivative;
    calculating a ratio of the value of the single-cycle derivative over the value of a derivative of the start value and the end values of associated power data derivative when the direction of the current multi-cycle derivative changes; and
    generating the value and its cycle of the multi-cycle derivative when the ratio becomes larger than the threshold value, wherein the single-cycle derivative is a derivative of two particular power data in successive cycles.

13. The method of claim 11, further comprising:

setting a threshold value that is a reference value for determining the end of a current multi-cycle derivative;

calculating a difference from a highest value to a current value of the power data in the current multi-cycle derivative;

calculating a difference from the highest value to a start value of the power data in the current multi-cycle derivative;

calculating a ratio of the difference from the highest value to the current value of the power data over the difference from the highest value to the start value of the power data in the current multi-cycle derivative when the direction of the current multi-cycle derivative changes; and generating the end-value and its end-cycle of the current multi-cycle derivative when the ratio becomes larger than the threshold value.

14. The method of claim 10, further comprising:

applying an automatic detection scheme to detect an end for an multi-cycle derivative, if an multi-cycle derivative is included in the summary, wherein the automatic detection scheme is one selected from single-cycle derivative (SCD)/MCD, DROP/TOP, and a combination thereof.

* * * * *